(12) United States Patent
Ishimura et al.

(10) Patent No.: US 7,038,251 B2
(45) Date of Patent: May 2, 2006

(54) SEMICONDUCTOR DEVICE (75) Inventors: Eitaro Ishimura, Tokyo (JP); Masaharu Nakaji, Tokyo (JP); Eiji Yagyu, Tokyo (JP); Nobuyuki Tomita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/038,254

(22) Filed: Jan. 21, 2005

(65) Prior Publication Data
US 2005/0263787 A1 Dec. 1, 2005

(30) Foreign Application Priority Data
May 25, 2004 (JP) .............................. 2004-154437

(51) Int. Cl.
*H01L 29/732* (2006.01)
(52) U.S. Cl. ...................................... 257/186; 257/438
(58) Field of Classification Search ................ 257/186, 257/438, 187, 189, 184, 22, 21
See application file for complete search history.

(56) References Cited
U.S. PATENT DOCUMENTS
6,229,162 B1 * 5/2001 Watanabe .................... 257/186

OTHER PUBLICATIONS
Watanabe et al.; "Planar-structure Superlattice APDs", *Technical Report of IEICE*, LQE97-79, pp. 69-74 (Oct. 1997).

* cited by examiner

*Primary Examiner*—Minhloan Tran
*Assistant Examiner*—Benjamin Tzu-Hung Liu
(74) *Attorney, Agent, or Firm*—Leydig, Voit & Mayer, Ltd.

(57) ABSTRACT

A semiconductor device has a structure reducing resistances to a high frequency current. The semiconductor device includes a semi-insulating substrate, a first n-type layer made of a compound semiconductor, and a first p-type layer made of a compound semiconductor in which a signal current flows in a lateral direction, parallel to the semi-insulating substrate. The first p-type layer is sandwiched between the semi-insulating substrate and the first n-type layer. A second n type layer made of a compound semiconductor is between the semi-insulating substrate and the first p type layer. An alternating current component of the signal current flows through the second n type layer.

13 Claims, 12 Drawing Sheets

SEMICONDUCTOR DEVICE

BACKGROUND OF THE INVENTION

1. Field of the Invention

The present invention relates to a semiconductor device constructed with compound semiconductors, and particularly to a semiconductor device pertaining to a planar avalanche photodiode having a multiplication layer.

2. Description of the Related Art

A conventional planar avalanche photodiode, as shown in, for example, I. Watanabe et al., "Planar-structure Superlattice APDs", TECHNICAL REPORT OF IEICE., LQE97-79, pp. 69–74 (1997-10), has been of a construction in which formed on one surface of a semi-insulating InP substrate is an anti-reflection film (AR coat) 1, while stacked on the other surface thereof are a p type layer 3 made of InP or AlInAs with a high carrier density, a light absorption layer 4 made of p type InGaAs with a low carrier density, an electric field relaxation layer 8 made of p type InP or AlInAs, a multiplication layer 9 made of AlInGaAs/AlInAs superlattice or AlInAs as a single layer, an n type window layer (cap layer) 11 made of n type InAlAs with a high carrier density, an n type contact layer 12 made of n type InGaAs with a high carrier density and an n type side electrode 10.

Figure 10:
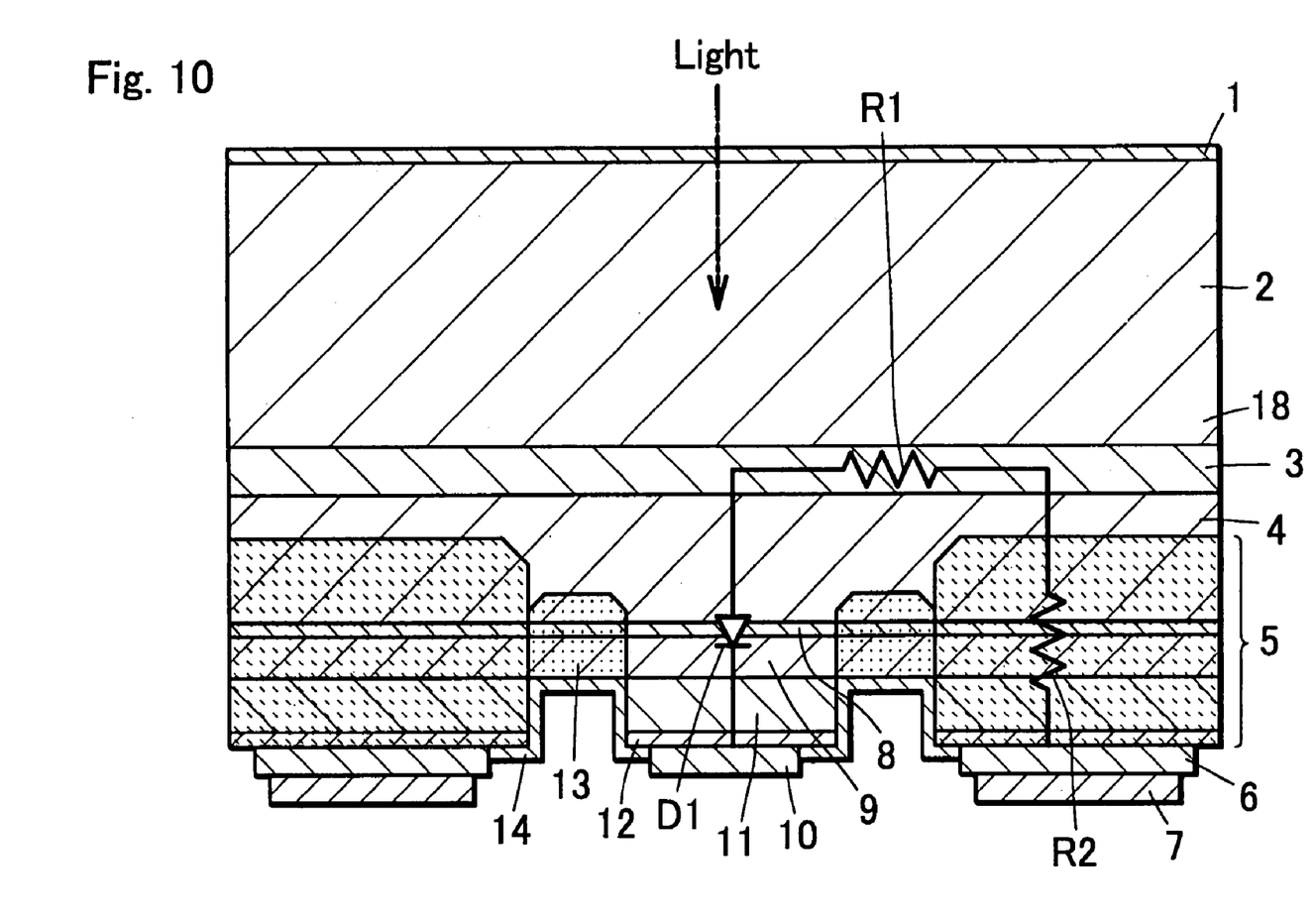
FIG. 10 is a sectional view of a conventional example avalanche photodiode.

In a conventional planar avalanche photodiode of FIG. 10, a groove for isolating an n type InAlAs window layer 11 (an n type cap layer 11) constituting a diode from a p type layer is formed around the n type cap layer 11, a p type high carrier density layer 5 is formed so as to be of a p type conductivity and have a high carrier density with Zn diffusion outside the groove and a p type side electrode 6 is formed thereon. A guard ring region 13 injected with Ti ions is formed directly below the groove, which reduces a junction leakage current to secure a stable operation of the diode. An n type contact layer 12 made of an n type InGaAs with a high concentration is formed between the n type cap layer 11 and an n type side electrode 10 to decrease ohmic contact resistance. The device with such a construction is protected by a surface protective film 14 and fixed with bumps 7.

Figure 11:
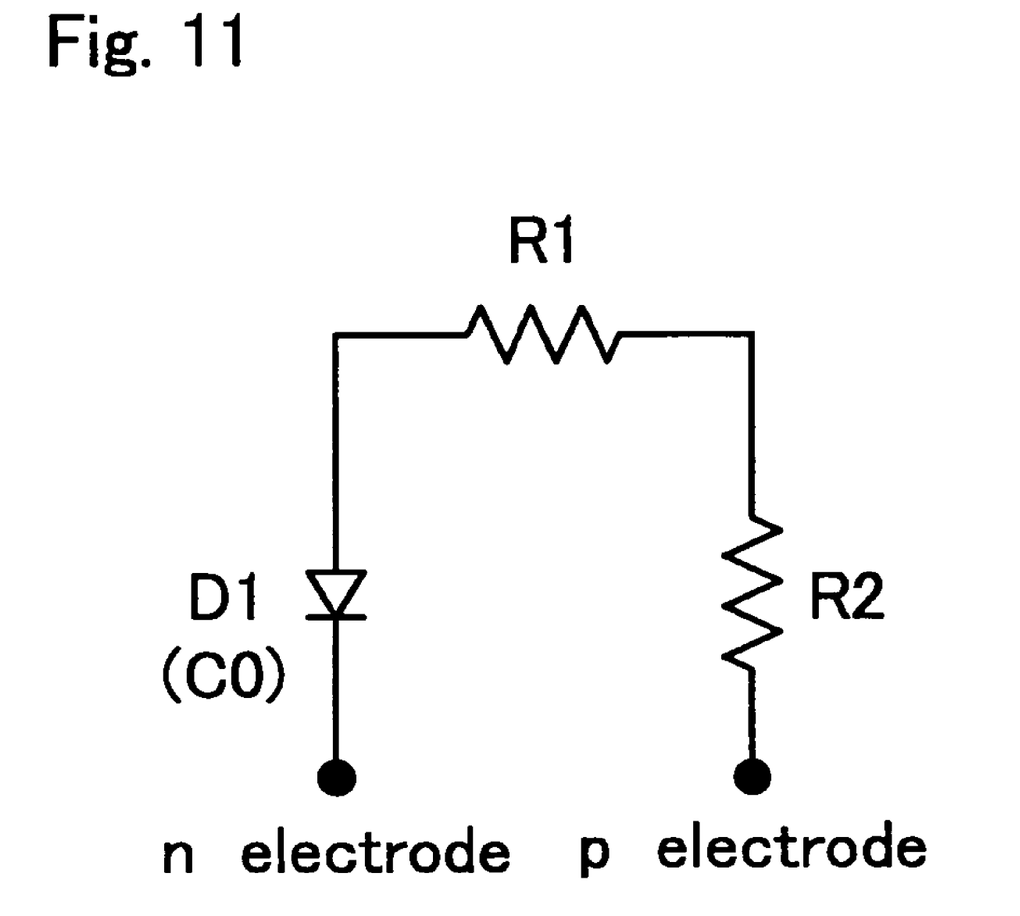
FIG. 11 is an equivalent circuit of the conventional example avalanche photodiode.

Using a circuit in FIG. 11, there is shown an equivalent circuit of the conventional planar avalanche photodiode with the construction described above, and a diode D1 and resistance values R1 and R2 correspond respectively to the pn junction serving as a light receiving region, the resistance of the p type layer 3 with a high carrier density and the sum of the resistance of the Zn diffusion region 5 and the ohmic resistance of the p type side electrode 6.

Then, description will be given of workings of the construction. Light is transmitted through the AR coat 1 to come in, from the InP substrate 2 side (the rear surface side). Since the semi-insulating InP substrate 2 and the p type layer 3 with a high carrier density have large bandgaps, light with a wavelength (1.3 µm or 1.55 µm) employed in common optical communication transmits those without being absorbed therein. The transmitted light is absorbed in the InGaAs light absorption layer 4 small in bandgap to generate electrons and holes. In an operating state, a high reverse bias voltage of the order of 25 V is applied across the avalanche photodiode (APD) and depletion occurs in the light absorption layer 4, the electric field relaxation layer 8 and the multiplication layer 9. In the depletion layer, holes flow toward the p type layer 3 with a high carrier density, while electrons flow toward the multiplication layer 9 across which a high electric field is applied. In this situation, electrons trigger avalanche multiplication in the multiplication layer 9 across which a high electric field is applied to thereby generate many of new electrons and holes. As a result, an optical signal is taken out to the outside as a multiplied signal current. A signal current tens of times as large as that when no multiplication occurs can be taken out by the multiplication.

While an avalanche photodiode can be employed in optical communication at a higher bit rate with a wider response band, a response band of an avalanche photodiode is restricted mainly by three factors including "a travel time of an electron or a hole through a depletion layer", "a time causing avalanche multiplication" and "a discharge/charge time on a circuit to be determined by a CR time constant."

"The travel time of an electron or a hole through a depletion layer" and "the time causing avalanche multiplication" decrease with a smaller thickness value of the light absorption layer 4 or the multiplication layer 9.

Then, attention will be directed to "a discharge/charge time on a circuit to be determined by a CR time constant"; a response band fc (a cut-off frequency is a frequency at which a frequency response takes −3 dB) is given as fc=½(2πCR) using a CR time constant, and thereby with decrease in value C or R, fc is larger.

In the conventional avalanche photodiode shown in FIG. 10, however, a problem has arisen that a cut-off frequency fc cannot be sufficiently high.

Description will be given using an equal circuit of FIG. 11; a cut-off frequency fc is given fc=½(2πC0×(R1+R2)). Herein, C0 is a capacitance of a pn junction of the diode D1, R1 is a resistance value of the p type layer 3 with a high carrier density and R2 is a resistance value obtained as the sum of the resistance value of the Zn diffusion region 5 and the ohmic resistance value of the p type side electrode 6. In a case of an avalanche phtodiode for 10 Gbps, a diameter of a pn junction is on the order of 45 µmφ and the capacitance C0 thereof is on the order of 0.25 pF. The resistance R2 is usually on the order of 5 Ω. In a case where a thickness of the p type layer 3 with a high carrier density is 2 µm, made of InP with a carrier density is 1×10$^{18}$ cm$^{-3}$, and a width of the Ti injected guard ring region is 20 µm, a resistivity of the p type InP layer with a carrier density of 1×10$^{18}$ cm$^{-3}$ is 0.08 Ω cm; therefore, R1 takes 56.6 Ω. If a load impedance of the avalanche photodiode is 50 Ω, fc=½(2×π×0.25 pF×(56.6+5+50))=5.7 GHz.

Figure 12:
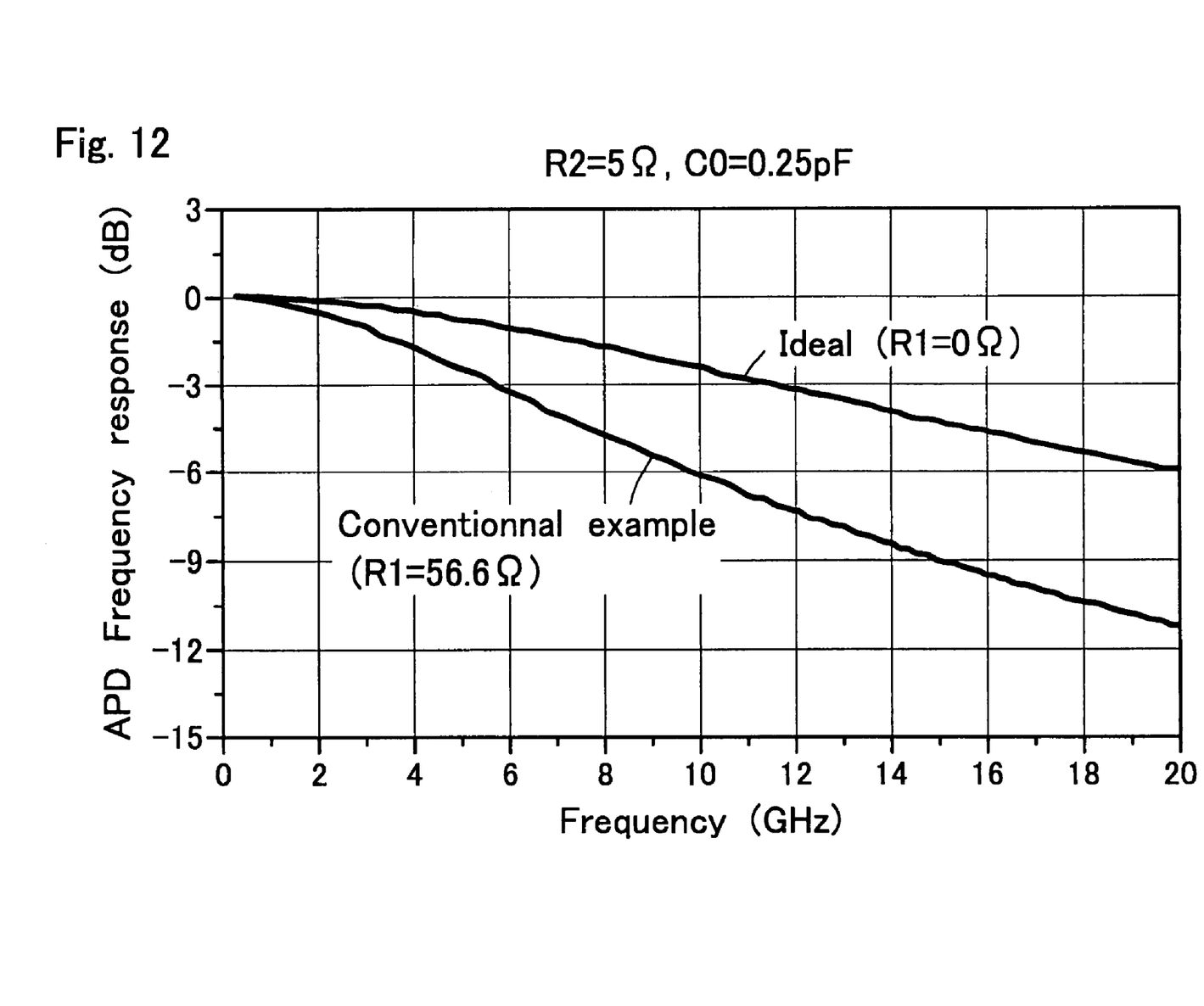
FIG. 12 is a graph showing a frequency response characteristic of the conventional example avalanche photodiode.

In FIG. 12, there is shown a result of calculation on a frequency response characteristic in a case where only the CR time constant is considered. In FIG. 12, a frequency response in a conventional example (R=56.6 Ω) is clearly lower than in an ideal case (R1=0) and a value in the conventional example does not meet the APD band fc (>10 GHz) necessary for receiving a digital signal of 10 Gbps. Incidentally, in order to meet a condition of an APD band fc (>10 GHz), it is necessary for R1 to be 8.7 Ω or less. In order to take 8.7 Ω or less for R1, a thickness of the p type layer 3 with a high carrier density is necessary to be 13 µm or more, whereas a reality negates crystal growth of such a thick layer if consideration is given to a manufacturing cost. Even if a carrier density of the p type layer 3 with a high carrier density is higher, an R1 value can be reduced, but with a higher carrier density, invalid light absorption is raised in the p type layer 3 to thereby lower the sensitivity of the APD. Moreover, a p type impurity introduced into the p type layer 3 at a high concentration in order to increase a carrier density is easy to be diffused out into peripheral layers to thereby diffuse into the InGaAs light absorption layer 4 and the InP substrate 2, which degrades a characteristic of the APD.

As a method to avoid the problem, if a polarity of n or p of conductivity types of all the layers is reversed (p type is changed to n type and vice versa), the p type layer 3 is changed to the n type layer, to thereby enable a resistance corresponding to R1 to be reduced. This method, however, cannot be applied to an avalanche photodiode with a an AlInAs layer or an AlGaAs layer as a multiplication layer. The reason therefor is because a necessity arises for electrons to be injected into the multiplication layer constituted by an AlInAs layer or an AlGaInAs layer to trigger multiplication, which necessitates the presence of a multiplication layer between an absorption layer and an n type layer, and if a polarity of p or n is reversed, a multiplication layer is, as a result, located between a p type layer and an absorption layer.

SUMMARY OF THE INVENTION

It is, accordingly, an object of the present invention to provide a semiconductor device having a structure capable of reducing a resistance of a current path when a high frequency current flows.

In order to achieve the object, a semiconductor device according to the present invention includes: a semi-insulating substrate; a first n-type layer made of compound semiconductor and a first p type layer made of compound semiconductor sandwiched between the semi-insulating substrate and the first n-type layer, a signal current flowing through the first p type layer in lateral direction parallel to the semi-insulating substrate, characterized in that a second n type layer made of compound semiconductor is formed between the semi-insulating substrate and the first p type layer and an alternating current component of the signal current flows through the second n type layer.

A semiconductor device according to the present invention with the construction described above is a semiconductor device constructed with a compound semiconductor, wherein an alternating current component (a high frequency component) of the signal current flows through the second n type layer that can be a layer with low resistance, with a p-n junction capacitance interposed between the first p type layer and the second n type layer, which enables a resistance for a high frequency of a current path to be low, and in turn, enables a high frequency characteristic to be improved.

DESCRIPTION OF THE PREFERRED EMBODIMENTS

Description will be given of embodiments according to the present invention below with reference to the accompanying drawings.

FIRST EMBODIMENT

An optical semiconductor device of a first embodiment according to the present invention is an avalanche photodiode and the avalanche photodiode is constructed in a similar way to that in the conventional example avalanche photodiode of FIG. 10 with the exception that in the conventional example avalanche photodiode of FIG. 10, an n type layer 18 is formed between the semi-insulating InP substrate 2 and the p type layer 3 with a high carrier density.

Figure 2:
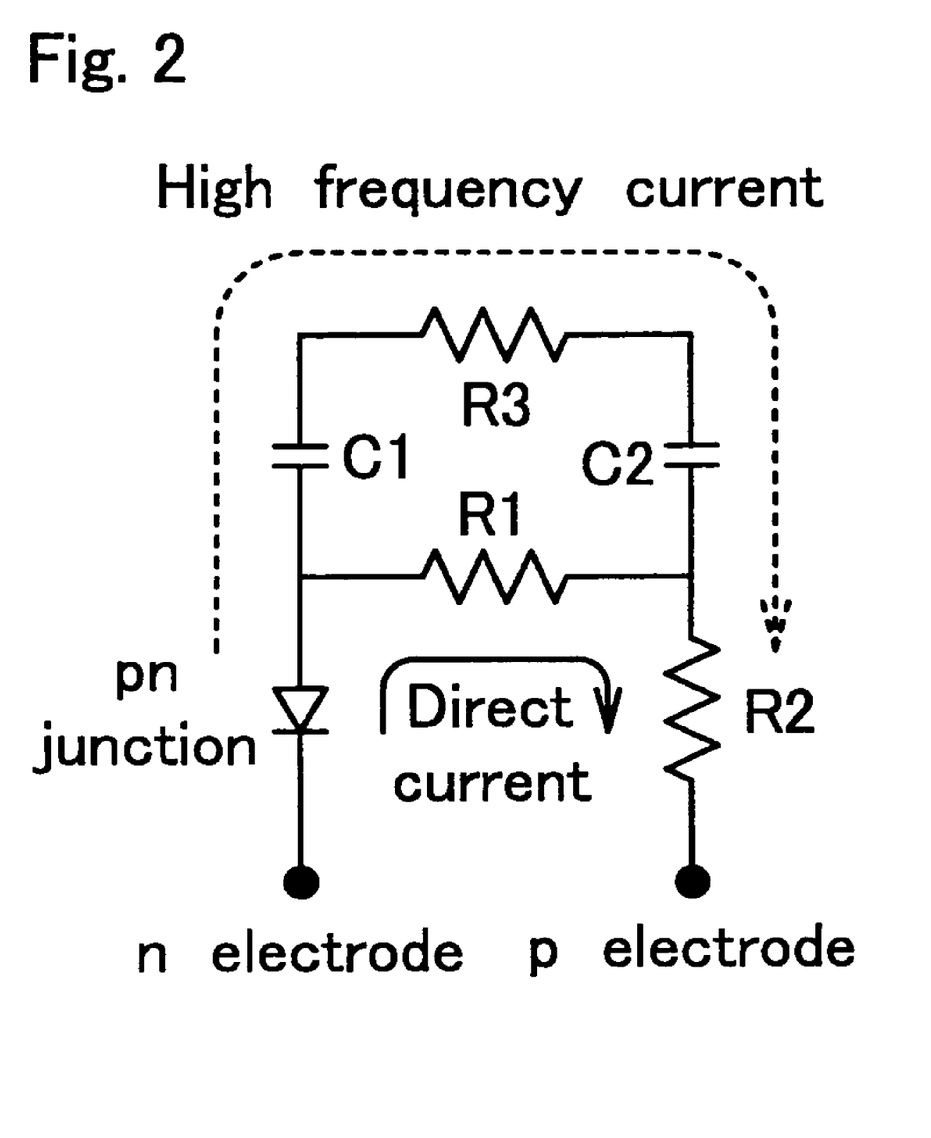
FIG. 2 is an equivalent circuit of the avalanche photodiode of the first embodiment.

That is, an equivalent circuit of the avalanche photodiode of the first embodiment is such that in the equivalent circuit of a conventional example avalanche photodiode shown in FIG. 11, as shown in FIG. 2, a series circuit including a capacitance C1, a resistance R3 and a capacitance C2 is connected in parallel to a resistance R1. Herein, in the equivalent circuit of FIG. 2, the capacitance C1 is a pn junction capacitance generated between a p type layer 3 in a light receiving region and an n type layer 18, the resistance R3 is a resistance caused by the n type layer 18 and the capacitance C2 is a pn junction capacitance formed between the p type layer 3 and the n type layer 18 in a p type side electrode region.

Then, description will be given of an effect of the first embodiment.

Figure 1:
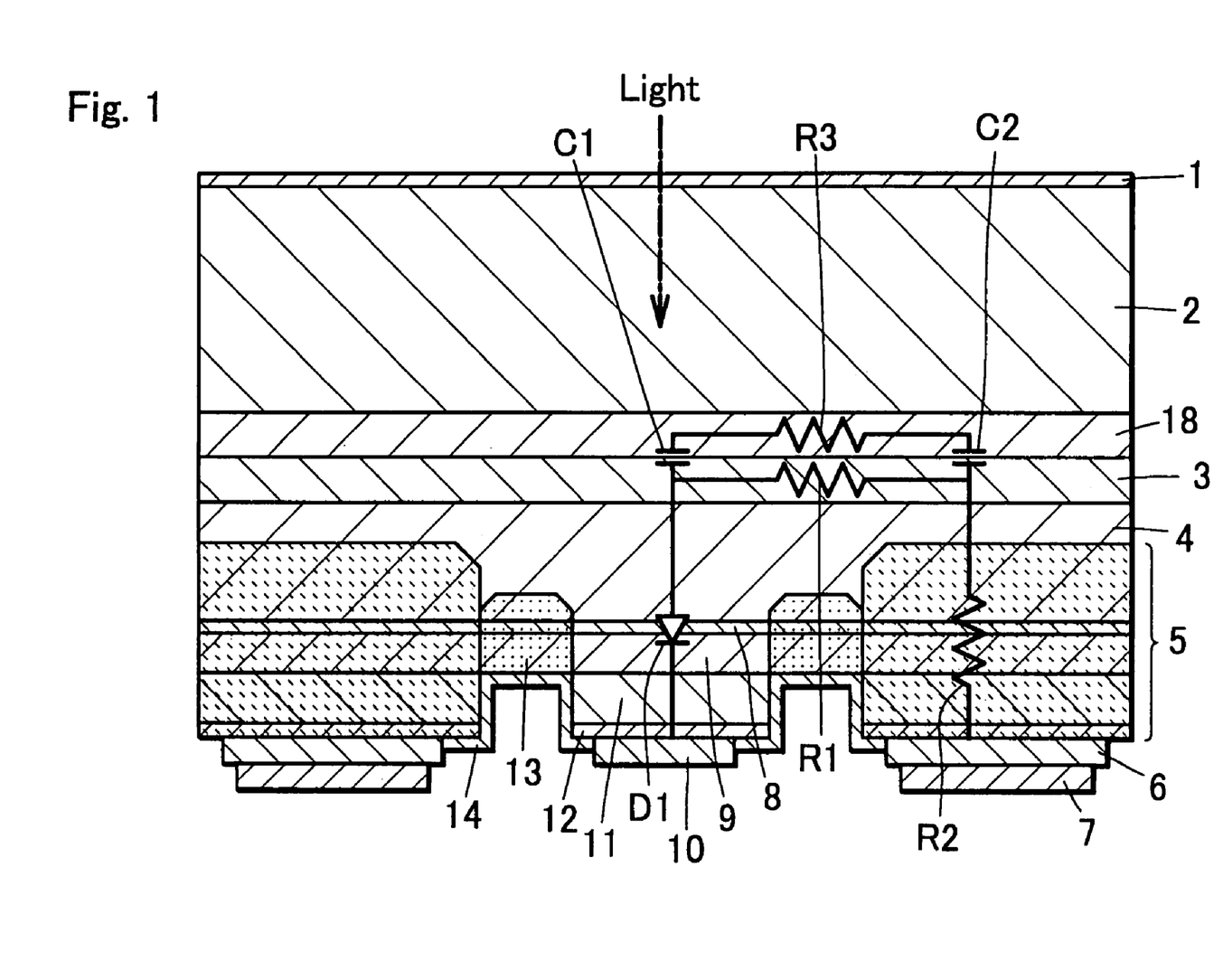
FIG. 1 is a sectional view of an avalanche photodiode of a first embodiment according to the present invention.

Generally, in a compound semiconductor, an n type layer has a resistance lower than a p type layer as far as both layers have the same carrier density. For example, if the p type layer 3 made of p type InP and the n type layer 18 made of n type InP, both layer with the same carrier density and the same layer thickness, are grown as a crystal as shown in FIG. 1, a resistance R3 is R3=R/20 since a resistivity of an n type InP is smaller than that of a p type InP and is 1/20 times as large as that of the p type InP.

Therefore, as shown in FIG. 2, of a signal current generated at the pn junction of the diode D1, a direct current flows through the resistance R1 and reaches the resistance R2, while most of a high frequency signal, which is an alternating component, flows through the capacitance C1, through the resistance R3 and through the capacitance C2 to the resistance R2. This is because as described above, R3 is sufficiently smaller than R1. As a result, in a case of a high frequency signal of several GHz, the value of R determining a CR time constant is equal to a value about 1/20 times as large as that without the n type layer 18.

Calculation will be actually done on and an improving effect of the n type layer 18 formed (in the equivalent circuit, the resistance R3 sufficiently lower in value than the resistance R1 is in parallel connected to the resistance R1 through the capacitance C1 and C2).

In the calculation, first of all, the resistance R1 and the resistance R3 are obtained. A thickness of the p type InP layer 3 of the conventional example (FIG. 10) is 2 µm and a carrier density thereof is $1 \times 10^{18}$ cm$^{-3}$. A value of the resistance R1 of the conventional example is 56.6 Ω as shown in description of the conventional example. In a case of the first embodiment, thickness values of the p type 3 InP layer and the n type InP layer 18 are 1 µm each (2 µm in total) and a carrier density of the p type InP layer 3 is $1 \times 10^{18}$ cm$^{-3}$ and a carrier density of the n type InP layer 18 is $5 \times 10^{18}$ cm$^{-3}$.

The reason why a carrier density of the n type layer 18 made of n type InP is higher than that of the p type layer 3 made of p type InP is that n type impurities (sulfur, and silicon and the like) is lower in diffusion to an adjacent layer and also in light absorption loss as compared with p type impurities (zinc, beryllium and the like): The resistance R1 is two times as large as that of the conventional example (R1=113.2 Ω) since a thickness of the p type layer 3 made of p type InP is a half thereof, while a value of the resistance R3 is 1/100 times as large as that of the resistance R1 (R3=R1/100=1.1 Ω) since a resistivity of the n type layer 18 made of n type InP is 1/20 times as large as that of the p type layer 3 and a resistivity is in inverse proportion to a carrier density.

Then, the capacitance C1 and the capacitance C2 are obtained. A diameter of a pn junction of the light receiving section is 45 µmφ and a dielectric constant of the InP layers is 12.1. Since a voltage (1.35 V) corresponding to a built-in potential of the InP layers is applied between the p type layer 3 made of p type InP and the n type layer 18 made of n type InP, the capacitance C1 is calculated to be 3.6 pF. On the other hand, the capacitance C2, if a chip size is 300 µm×300 µm, C2=C1×53=190 pF since an area outside the guard ring 13 is about 53 times as large as that of the light receiving section.

Figure 3:
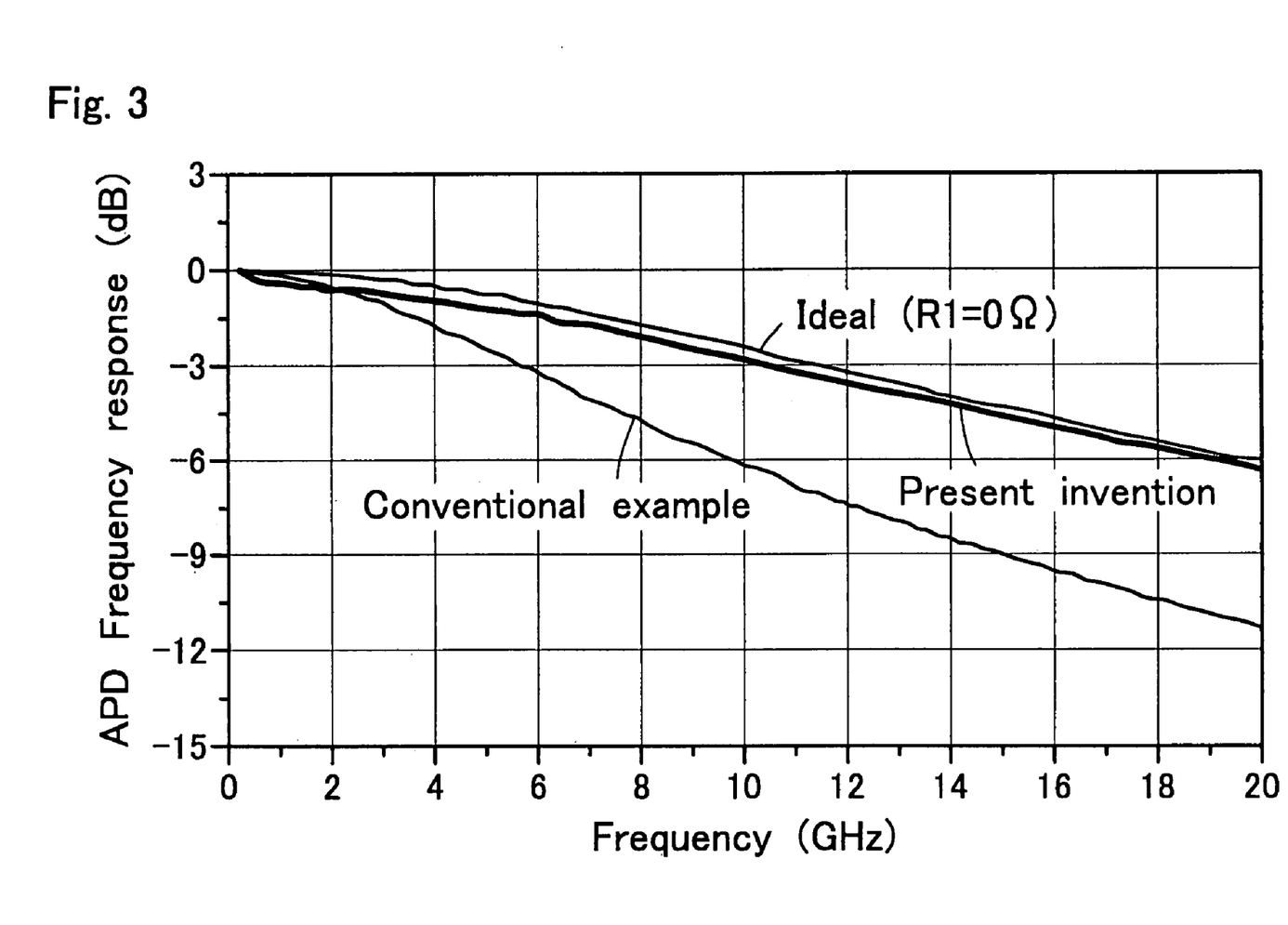
FIG. 3 is a graph showing a frequency response characteristic of the avalanche photodiode of the first embodiment.

In FIG. 3, there is shown a result of the calculation conducted with the values (R1=113 Ω, R2=5 Ω, R3=1.1 Ω, C0=0.25 pF, C1=3.6 pF, C2=190 pF). In the first embodiment in which the n type layer 18 made of n type InP is formed, as shown in FIG. 3, the band fc in which a frequency response is −3 dB is improved to a value of the order of 11 GHz less than 2 times as large as that of a conventional case (the parameters of conventional example are the same as in FIG. 11). The result of the present invention is almost equal to that in an ideal case (R1=0). In the calculation of APD frequency response, only CR time constant is considered.

Figure 4:
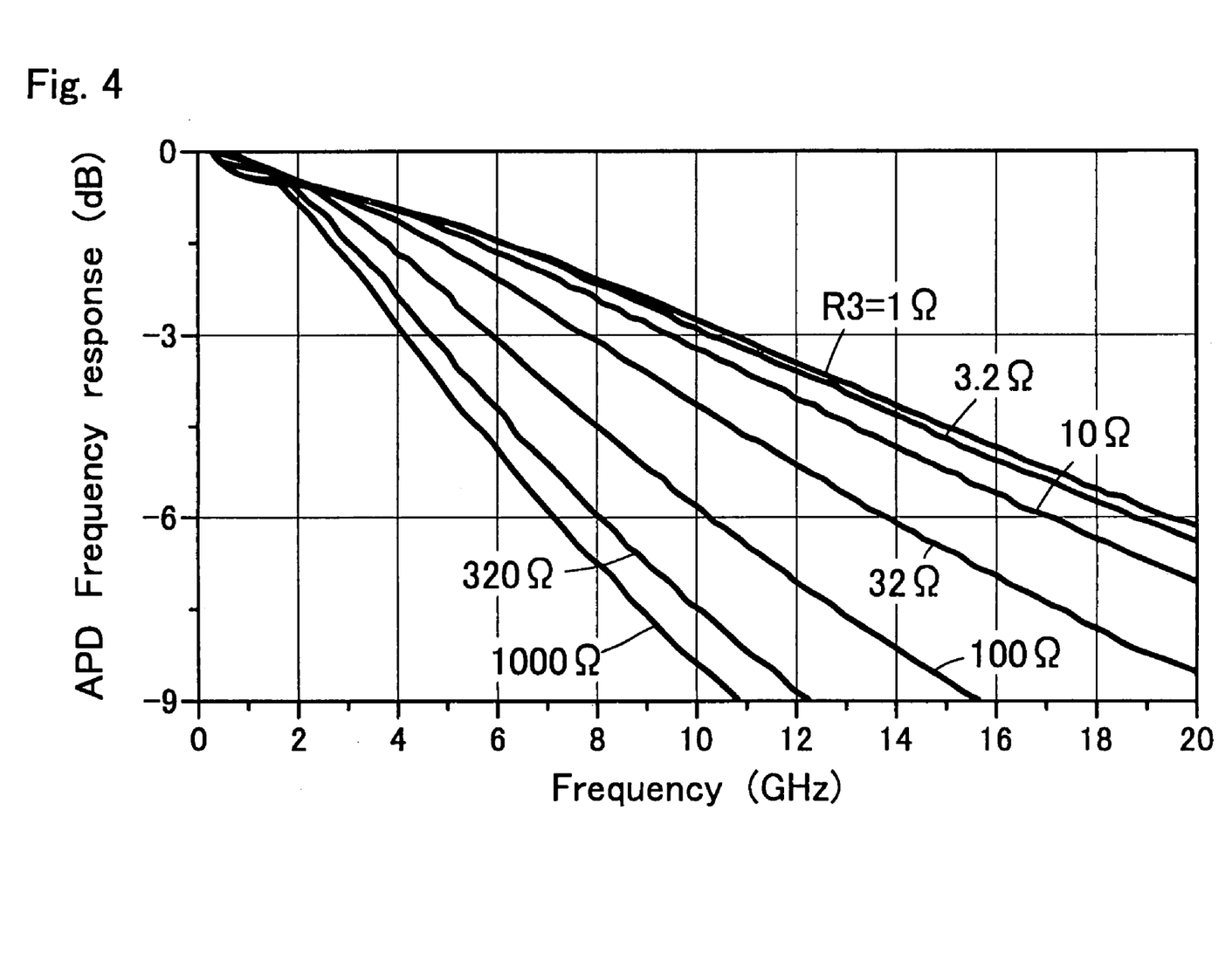
FIG. 4 is a graph showing frequency response characteristics for various resistance values R3 of the avalanche photodiode of the first embodiment.

In FIG. 4, there are shown changes in frequency response characteristics of the avalanche photodiode of the embodiment with changes in R3. The other values are fixed (R1=113 Ω, R2=5 Ω, 1 Ω, C0=0.25 pF, C1= 3.6 pF, C2=190 pF). As shown in FIG. 4, in a case where R3 is 100 Ω or less, a band can be broader than a band of a conventional example (to 6 Hz). In a case where R3 is 10 Ω or less, it is found that a band of the order of 10 GHz can be obtained. Furthermore, in order to set R3 to 100 Ω or less, if a thickness of the n type layer 18 is W (µm) and a carrier density thereof is N (1/cm$^3$) by definition, N×W>~$5 \times 10^{16}$. In order to set R3 to 10 Ω or less, N×W>~$5 \times 10^{17}$ and in order to set R3 to 2 Ω or less, N×W>~$2.5 \times 10^{18}$.

As described above, by inserting the n type layer 18 between the semi-insulating InP substrate 2 and the p type layer 3 with a high carrier density, since, of a signal current flowing between the p type side electrode 6 and the n type electrode 10, an alternating component can flow through the n type layer 18 with a low resistance, a high frequency characteristic in a planar avalanche photodiode can be improved.

Therefore, according the first embodiment, there can be provided an avalanche photodiode with a high cut-off frequency.

As another effect, the n type layer 18 can prevent a p type impurity of the p type layer 3 from diffusing to the semi-insulating substrate 2. This is because a p type impurity is harder by nature to diffuse into a bulk where an n type impurity already exists.

SECOND EMBODIMENT

Then, description will be given of an avalanche photodiode of a second embodiment according to the present invention.

In the first embodiment, description is given of the case where the p type layer 3 and the n type layer 18 are made of InP, while in the second embodiment, description will be given of an example in which the p type layer 3 and the n type layer 18 are made of another compound semiconductor in an avalanche photodiode with a structure of FIG. 1.

To be detailed, in the present invention, as the p type layer 3 and the n type layer 18, for example, one selected from the group consisting InAlAs, InGaAsP, AlGaInAs and InGaAs may be used in one layer or in both layers. In a case where the substrate is made of GaAs, GaAs or AlGaAs may be used in one layer or both layers as a structural material.

In the present invention, to form both or one of the p type layer 3 and the n type layer 18 with a compound semiconductor with a bandgap almost less than 1 eV is advantageous in the following way. That is, in order to increase the capacitance C1 and the capacitance C2, it is required either to increase carrier densitys of the p type layer 3 and the n type layer 18 or to diminish bandgaps thereof to thereby decrease a built-in potential (a band gap is almost equal to a built-in potential). Generally, a capacitance formed at a pn junction when no bias is applied is in proportion to the square root of a carrier density and in inverse proportion to the square root of a built-in potential.

Figure 5:
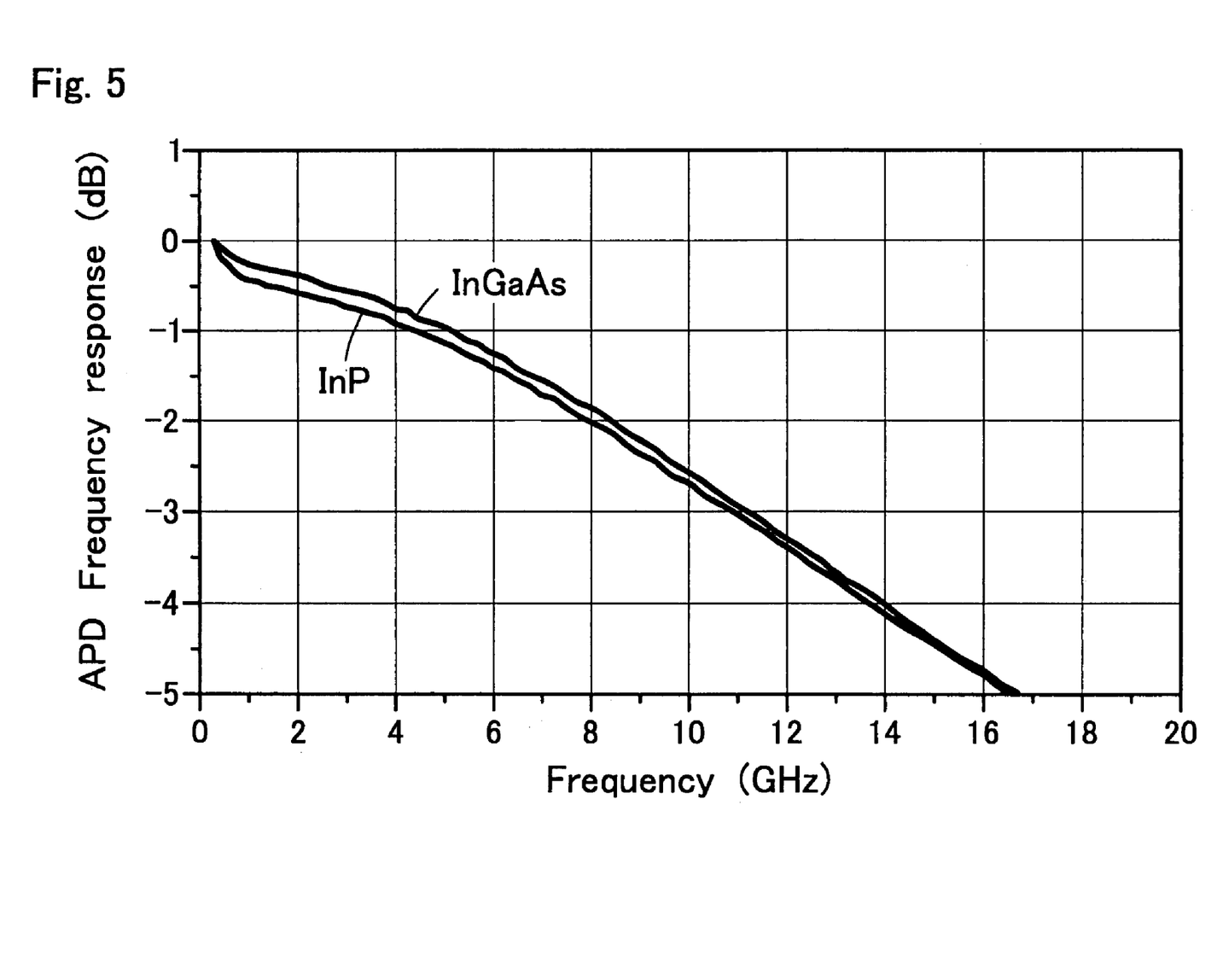
FIG. 5 is a graph showing frequency response characteristics of avalanche photodiodes of a second embodiment of the present invention.

For example, the built-in potential of InGaAs is 0.75 V and 56% of 1.35 V in a case of InP. Therefore, if both the p type layer 3 and the n type layer 18 are made of InGaAs, the C1 and C2 can be increased about 34% to thereby cause high frequency to flow in the n type layer 18 (the resistance R3) with more of ease. If both the p type layer 3 and the n type layer 18 are made of InGaAs instead of InP, a frequency characteristic is improved by the effect as shown in FIG. 5. In the case of InP, the calculation conducted with the values (C0=0.25 pF, C1=3.6 pF, C2=190 pF, R1=113 Ω, R2=5 Ω, R3=1.13 Ω) In the case of InGaAs, the calculation conducted with the values (C0=0.25 pF, C1=6.48 pF, C2=281.2 pF, R1=56.5 Ω, R2=5 Ω, R3=0.565 Ω).

Figure 6:
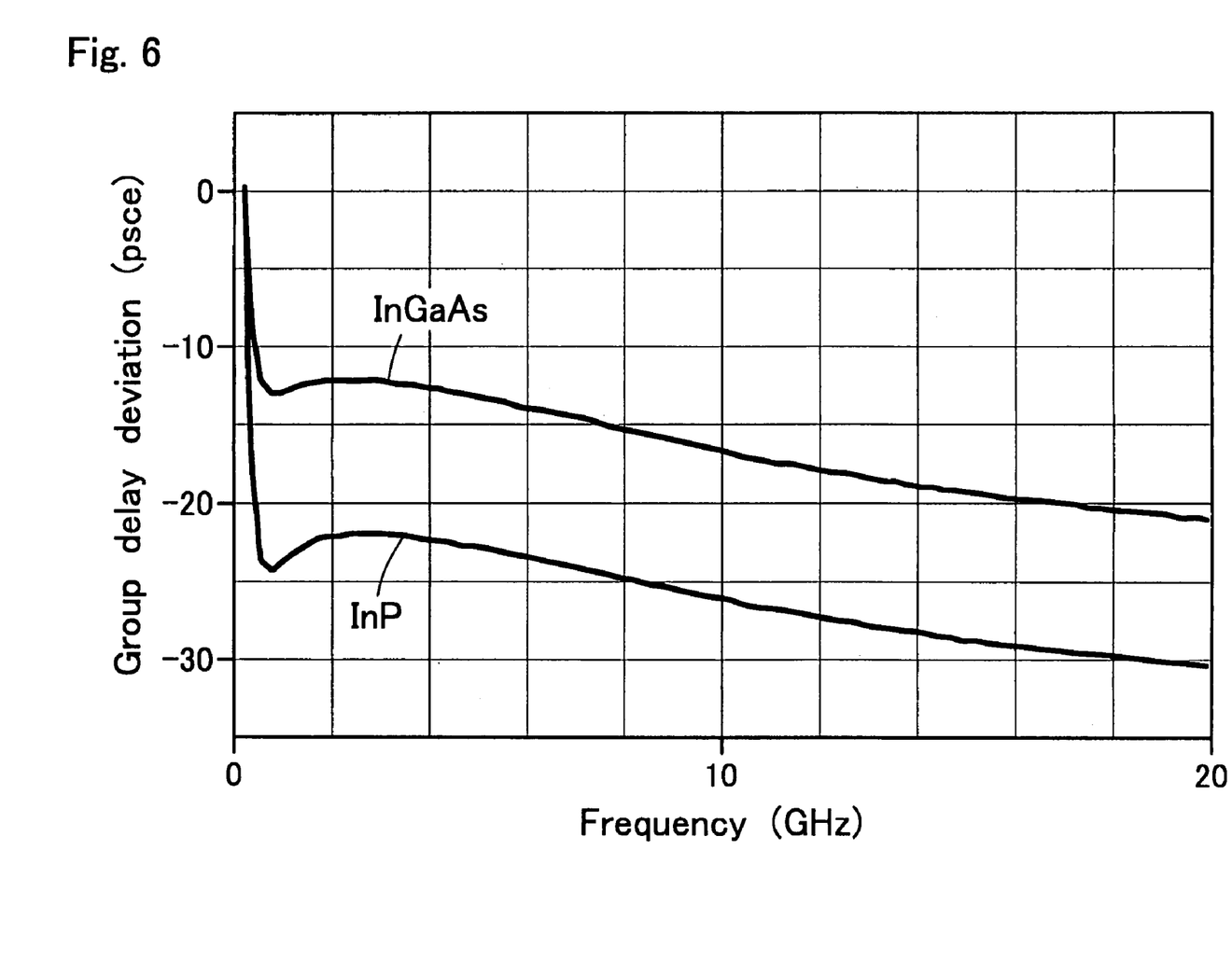
FIG. 6 is a graph showing group delay deviations of the avalanche photodiodes of the second embodiment.

An effect in a case where both the p type layer 3 and the n type layer 18 are made of InGaAs instead of InP, a group delay deviation (phase shift) is conspicuously revealed. With a large group delay deviation, a jitter occurs in a reception waveform to thereby render the reception waveform into disorder. The case where both layers are made of InGaAs is improved to about half in group delay deviation as compared with the case where both are made of InP (FIG. 6).

When the p type layer 3 and the n type layer 18 are made of one selected from the group consisting of InGaAs, InGaAsP and AlGaInAs, a bandgap of each being smaller than that (1.35 eV) of InP, a resistivity is generally smaller than that of InP having a larger bandgap, provided that the same carrier density is adopted in the layers. For example, a resistivity of InGaAs (with a bandgap of 0.75 eV) is about a half times as large as that of InP at the same carrier density. In the equivalent circuit of FIG. 2, it is clear that the larger the capacitance C1 and the capacitance C2 are, the easier a high frequency current is to flow through the resistance R3.

In such a way, by using a material with a comparatively small bandgap (almost smaller than 1 eV), a frequency characteristic is improved.

THIRD EMBODIMENT

Figure 7:
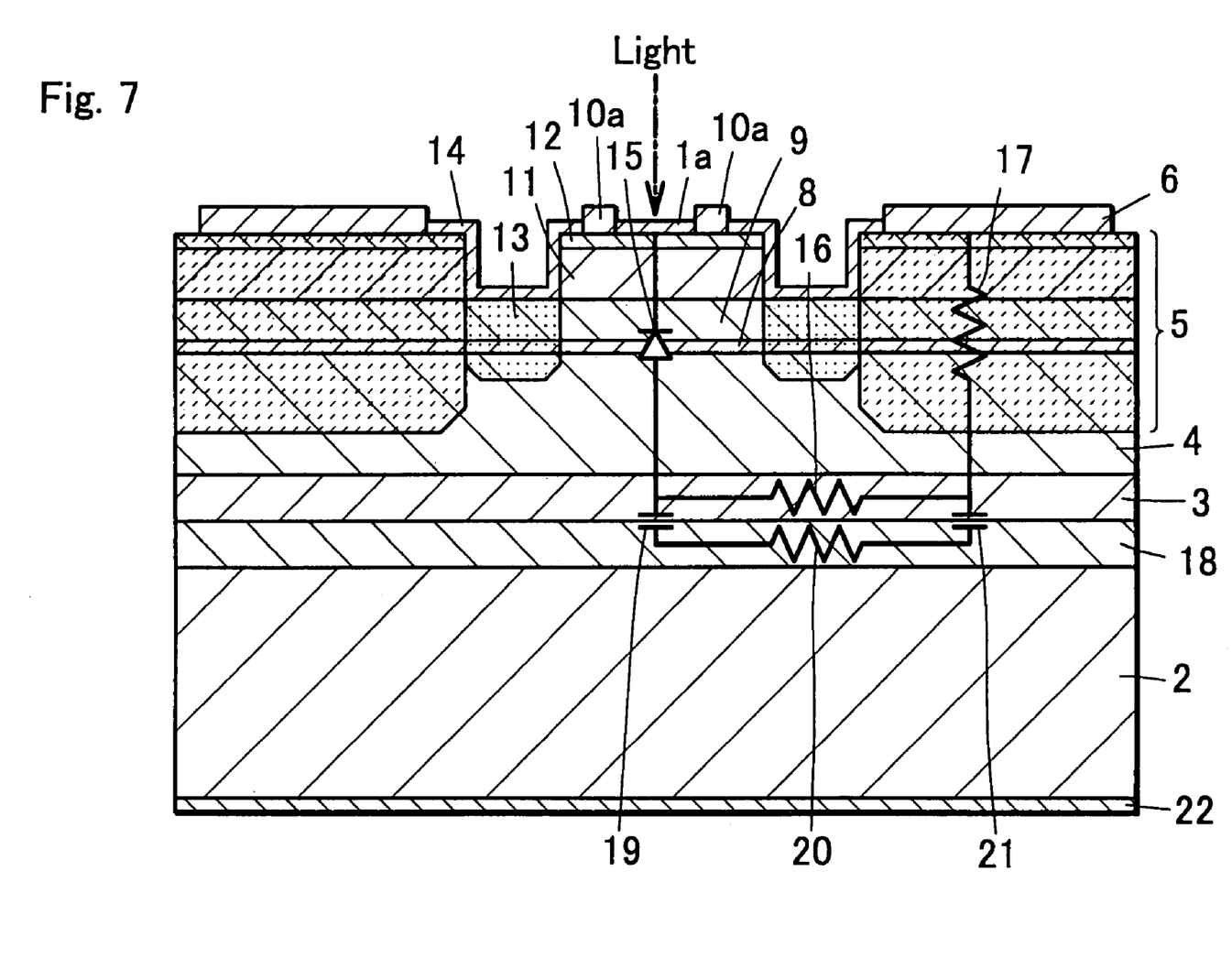
FIG. 7 is a sectional view of an avalanche photodiode of a third embodiment according to the present invention.

An avalanche photodiode of a third embodiment is similar in fundamental compound semiconductor layer structure to that of the first embodiment with the exception that light comes in through the substrate 2 in the avalanche photodiode of the first embodiment, while in an avalanche photodiode in the third embodiment, light comes in from the side on which the n type side electrode is formed.

The detailed differences from the first embodiment are the following items.
(1) A metal film 22 for device bonding is formed instead of the antireflection film 1 on the rear surface of the InP substrate 2.
(2) An annular n type side electrode 10a having an opening for incident light to come in is formed in instead of the n type side electrode 10.
(3) An antireflection film 1a is formed on the n type contact layer 12 in the opening of the n type side electrode 10a.

The avalanche photosensitive diode of the third embodiment is constructed in a similar way to that in the first embodiment with the exception of the items (1) to (3).

The construction of the third embodiment is suitable for a case where a material with a small bandgap such as InGaAs is used in the p type layer 3 and the n type layer 18, which is described in the second embodiment.

That is, in a case where a material with a small band gap is used in the p type layer 3 and the n type layer 18, light is absorbed in the p type layer 3 and the n type layer 18 both having small band gaps if light comes in from the substrate 2 side as shown in FIG. 1, and as a result, a problem has arisen that the sensitivity of the avalanche photodiode is reduced. In such a case, with a construction in which light comes in from the an epitaxial growth layer side as shown in FIG. 7 adopted, incident light reaches the light absorption layer 4 without receiving an influence of absorption in the p type layer 13 and the n type layer 18.

FOURTH EMBODIMENT

Figure 8:
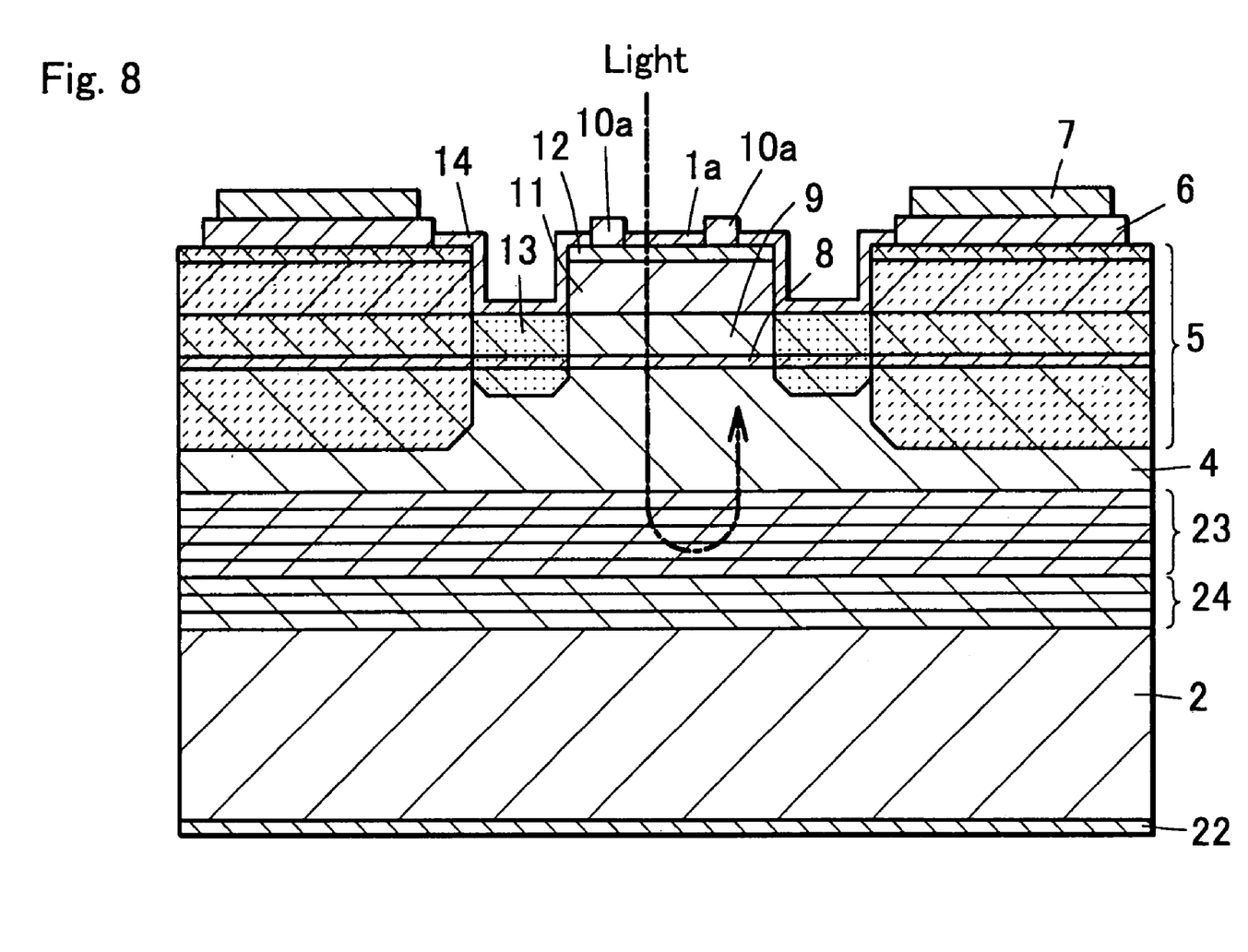
FIG. 8 is a sectional view of an avalanche photodiode of a fourth embodiment according to the present invention.

An avalanche photodiode of a fourth embodiment according to the present invention is constructed in a similar way to that in the third embodiment with the exception that in the avalanche photodiode of the third embodiment, a p type reflection multilayer 23 is formed instead of the p type layer 3 and an n type reflection multilayer 24 is formed instead of the n type layer 18.

A reflection multilayer of the fourth embodiment herein is of a construction that is formed by repeated stacking of materials each having a different refractive index from the other and each having as a layer an optical thickness ¼ times as large as a incident light wavelength, for example, a construction of repeated stacking such as InP/InGaAs(P)/ InP/InGaAs(P)/ . . . or AlInAs/(Al)GaInAs/AlInAs/(Al) GaInAs/ . . . .

In an avalanche photodiode of the fourth embodiment, of incident light, light that is not absorbed in the light absorption layer 4 and transmitted therethrough can be again reflected back by the reflection multilayers 23 and 24 to the light absorption layer, thereby enabling a light absorption efficiency to be enhanced.

For example, in order to reflect light of wavelength of 1.55 µm 50% or more by the reflection multilayers 23 and 24, a structure of a reflection multilayer is a laminate of about ten pairs of InP/InGaAs(P) or AlInAs/(Al)GaInAs with a thickness of each layer set to almost 0.1 µm.

In the avalanche photodiode of the fourth embodiment with the construction, by using the p type reflection multilayer 23 and the n type reflection multilayer 24 instead of the p type layer 3 and the n type layer 18, respectively, an alternating component of a signal current flowing between the p type side electrode 6 and the n side electrode 10a can flow through the n type reflection multilayer 24 with a lower resistance, thereby enabling a high frequency characteristic to be improved.

Accordingly, according to the avalanche photodiode of the fourth embodiment, there can be provided a planar avalanche photodiode excellent in high frequency characteristic and with a high light receiving sensitivity.

While in the fourth embodiment described above, the p type reflection multilayer 23 and the n type reflection multilayer 24 are used instead of the p type layer 3 and the n type layer 18, respectively, the present invention is not limited to the pair and a reflection multilayer may be used instead of one of the p type layer 3 and the n type layer 18.

With such a construction adopted, there are exerted an action and an effect similar to those in the fourth embodiment.

Description is given of the avalanche photodiodes in the first to the fourth embodiments, but application of the present invention is not limited to an avalanche photodiode and can be effective for other devices constructed with compound semiconductor.

That is, the present invention acts and is effective so that in a device constructed with compound semiconductor including a p type layer with a resistance value higher than an n type layer, a high frequency current path including an n type layer with a low resistivity is formed in parallel to the p type layer serving a current path to thereby reduced a resistance value for the high frequency current; therefore, the present invention can be widely applied to devices other than an avalanche photodiode.

As other applications, to be detailed, while it is needless to say that the present invention can be applied to a waveguide photodiode, a surface incident photodiode and a waveguide avalanche photodiode constructed by stacking compound semiconductor layers on a semi-insulating substrate, the present invention can further applied to a surface incident optical modulator and an end face incident optical modulator to which a high frequency signal for optical modulation is inputted. In the devices, an n type layer is formed so that a high frequency current path including the n type layer with low resistance is connected in parallel to a current path of a p type layer, thereby improving a high frequency characteristic.

Note that in an optical modulator, light absorptivity in an light absorption layer is changed by a voltage applied between an n type side electrode and a p type side electrode to thereby modulate light inputted to the light absorption layer in tune with a signal current.

Figure 9:
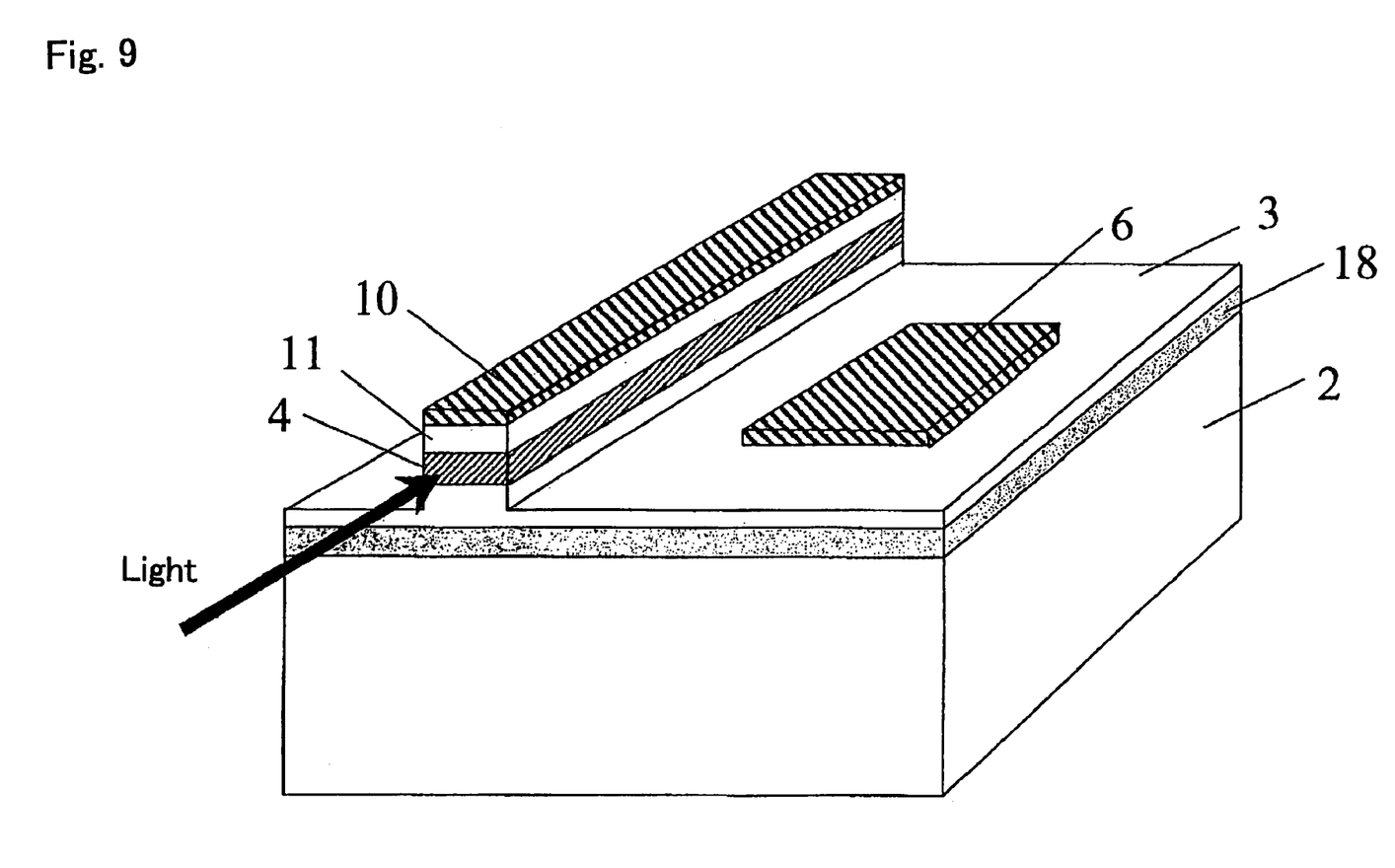
FIG. 9 is a perspective view showing a construction of a semiconductor device of a modification according to the present invention.

Especially, in an end incident (waveguide) optical device such as a photodiode, an optical modulator or the like as shown in FIG. 9, since light is caused to come in along an end face direction thereof and light does not pass through an n type layer, an advantage is enjoyed that an optical characteristic is not affected by a chemical composition (a bandgap) of a semiconductor material used in the n type layer 18, thereby enabling a semiconductor material with lower resistance as the n type layer 18 to be selected.

Besides, the present invention can be applied to optical devices other than a photodiode and an optical modulator.

Especially, the present invention is applied to a surface emitting laser diode, an end face emitting laser diode and the like, with which optical modulation can be implemented, thereby enabling a high frequency characteristic to be improved.

What is claimed is:

1. A semiconductor device comprising;
   a semi-insulating substrate,
   a first n-type layer of a compound semiconductor,
   a first p-type layer of a compound semiconductor in which a signal current flows in a lateral direction, parallel to the semi-insulating substrate, the first p-type layer being sandwiched between the semi-insulating substrate and the first n-type layer, and
   a second n type layer of a compound semiconductor between the semi-insulating substrate and the first p type layer, wherein an alternating current component of the signal current flows through the second n type layer.

2. The semiconductor device according to claim 1, wherein
   the second n-type layer is selected from the group consisting of InGaAs, AlGaInAs, and InGaAsP, and
   band gap energy of the second n-type layer does not exceed 1 eV.

3. The semiconductor device according to claim 1, including a third layer between the first p-type layer and the first n-type layer.

4. The semiconductor device according to claim 3, wherein the third layer is a light absorption layer.

5. The semiconductor device according to claim 4, further comprising a multiplication layer between the first n-type layer and the light absorption layer, the multiplication layer being a material selected from the group consisting of a compound semiconductor without a dopant impurity, a n-type compound semiconductor having a carrier density less than the first n-type layer, and a p-type compound semiconductor having a carrier density less than the first n-type layer.

6. The semiconductor device according to claim 5, wherein the multiplication layer comprises a AlInAs layer or a AlGaInAs layer.

7. The semiconductor device according to claim 5, wherein the second n-type layer has a thickness W and a carrier density N and $N \times W > 5 \times 10^{16}$.

8. The semiconductor device according to claim 5, wherein the second n-type layer has a thickness W and a carrier density N and $N \times W > 5 \times 10^{17}$.

9. The semiconductor device according to claim 5, wherein the second n-type layer has a thickness W and a carrier density N and $N \times W > 5 \times 10^{18}$.

10. The semiconductor device according to claim 5, wherein light is input through the first n-type layer.

11. The semiconductor device according to claim 10, further comprising a reflection multilayer including alternately laminated first compound semiconductor layers and second compound semiconductor layers, which have a different refractive index from the first compound semiconductor layers, wherein the second n-type layer includes at least part of the reflection multilayer.

12. The semiconductor device according to claim 3, wherein the third layer is a material selected from the group consisting of InP, InAlAs, GaAs, AlGaAs, InGaAs, AlGaInAs, and InGaAsP.

13. The semiconductor device according to claim 4 wherein light absorption ratio of the light absorption layer varies according to a voltage applied between an n-side electrode connected to the first n-type layer and a p-side electrode connected to the first p-type layer.

* * * * *